US006662395B1

(12) United States Patent
Hamilton et al.

(10) Patent No.: US 6,662,395 B1
(45) Date of Patent: Dec. 16, 2003

(54) APPARATUS FOR CLEANING SURFACES WITH A CLEANING ROLLER ASSEMBLY

(76) Inventors: Sheila Hamilton, Nether Knockbuckle, Hazletteste Road Kilmacolm, Renfrewshire (GB); Charles Jonathan Kennett, Eilston House, Howwood, Renfrewshire PA9 1DH (GB)

( * ) Notice: Subject to any disclaimer, the term of this patent is extended or adjusted under 35 U.S.C. 154(b) by 0 days.

(21) Appl. No.: 09/566,170

(22) Filed: May 5, 2000

Related U.S. Application Data

(63) Continuation of application No. PCT/GB98/03342, filed on Nov. 9, 1998.

(30) Foreign Application Priority Data

Nov. 8, 1997 (GB) ................................................ 9723619

(51) Int. Cl.⁷ ............................................. B08B 11/00
(52) U.S. Cl. ..................................... 15/3; 15/102
(58) Field of Search ............................... 15/3, 77, 102

(56) References Cited

U.S. PATENT DOCUMENTS

| 4,009,047 A | | 2/1977 | Lindsay |
| 5,581,837 A | * | 12/1996 | Uchiyama |

FOREIGN PATENT DOCUMENTS

| DE | 1077960 | * | 3/1960 |
| EP | 0214741 A | | 3/1987 |
| EP | 0582436 A | | 2/1994 |
| FR | 1142692 A | | 9/1957 |
| JP | 0124442 | * | 10/1978 |

* cited by examiner

Primary Examiner—Randall E. Chin
(74) Attorney, Agent, or Firm—Dorsey & Whitney LLP

(57) ABSTRACT

A surface cleaning apparatus for cleaning workpiece surfaces. The apparatus has controllable operable cleaning rollers. The cleaning rollers can be moved selectively and independently such as to contact the workpiece in a desired sequence. The apparatus is particularly adapted for vertical operation.

5 Claims, 1 Drawing Sheet

APPARATUS FOR CLEANING SURFACES WITH A CLEANING ROLLER ASSEMBLY

Figure 1:
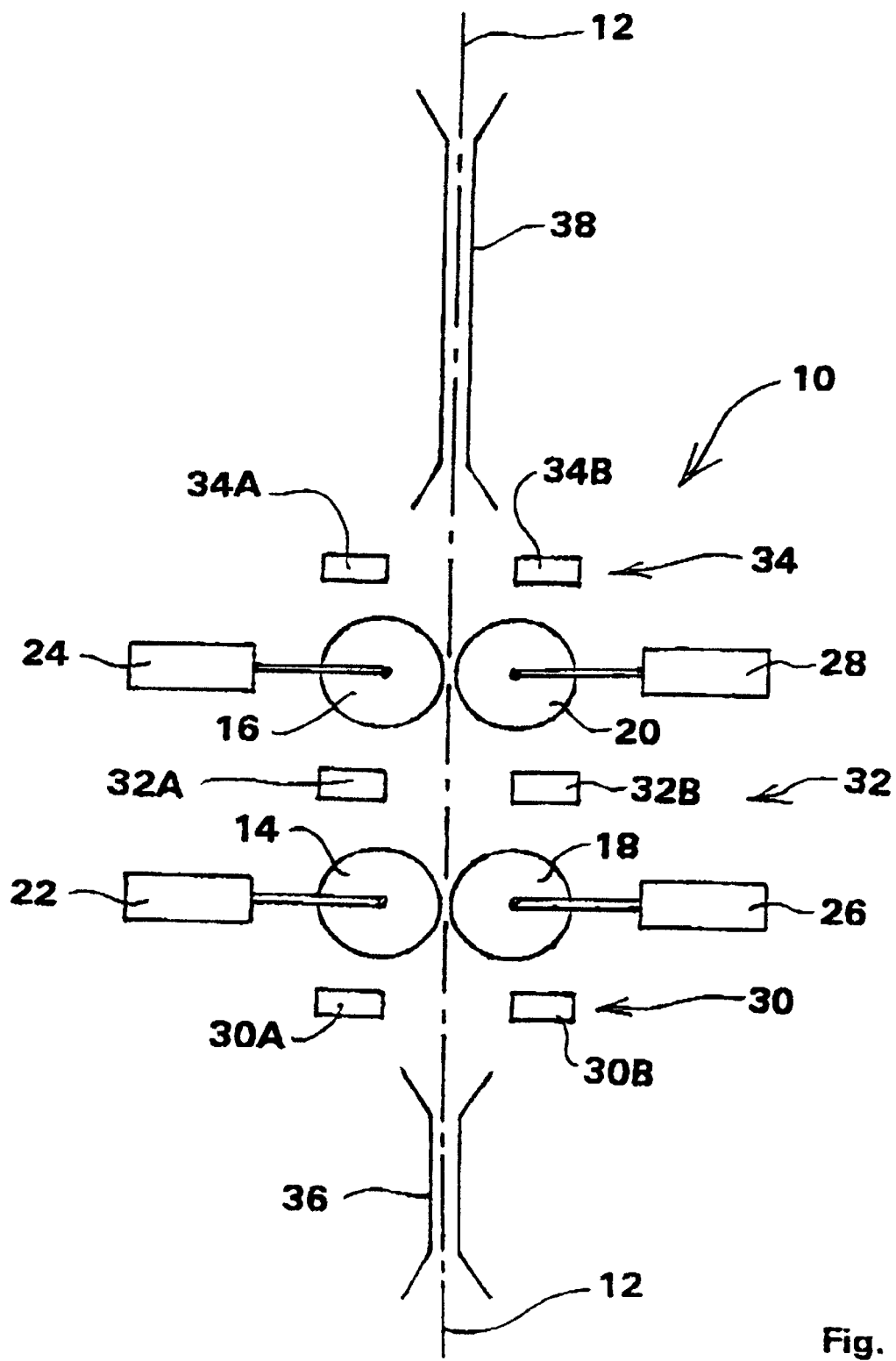

This application is a continuation of PCT application PCT/GB98/03342, filed Nov. 9, 1998.

This invention relates to cleaning, and relates more particularly but not exclusively to apparatus for the cleaning of surfaces.

There are certain articles and processes which require scrupulous cleanliness for proper functioning; for example photo-lichographic masks for semiconductor production require to be essentially free of surface particles in order that resultant integrated circuits should not be defective by reason of masking faults. While precautions can be taken to minimise surface contamination (for example, air filtration to trap airborne dust particles), it is essential or desirable to be able to clean surfaces in a manner that avoids damage to or dissolution of the surface, and is preferably easy to perform.

According to a first aspect of the present invention there is provided a surface cleaning apparatus for cleaning a first selected surface of a workpiece, the surface cleaning apparatus comprising a first pair of rotatably mounted surface-cleaning rollers, a selectively actuable workpiece urging means mounted in opposition to said first pair of rollers for selectively urging a workpiece present between said workpiece urging means and said first pair of rollers into contact with said first pair of rollers, and selectively operable roller lifting means for selectively and independently lifting either or both of said first pair of surface cleaning rollers away from said workpiece urging means and out of contact with a workpiece therebetween.

According to a second aspect of the present invention there is provided a surface cleaning apparatus for cleaning a first selected surface of a workpiece, the surface cleaning apparatus comprising a first pair of romatably mounted surface-cleaning rollers, a workpiece urging means mounted in opposition to said first pair of rollers to urge a workpiece present between said workpiece urging means and said first pair of rollers into contact with said first pair of rollers, and a workpiece path-defining means defining the path of a workpiece through said surface cleaning apparatus between said first pair of surface-cleaning rollers and said workpiece urging means with said first selected surface rending to be in contact with said first pair of surface-cleaning rollers.

Preferably, said workpiece path-defining means defines a workpiece path which is substantially vertical.

In said first and second aspects of the present invention, said workpiece urging means may comprise a second pair of rotatably mounted surface-cleaning rollers, the rollers of said first and second pairs being individually mutually opposed to form respective roller bights. In the second aspect of the invention, the roller lifting means preferably operates simultaneously and conjointly to lift both rollers of a bight to open the bight for the passage of the leading end of a workpiece between respective pairs of mutually separated rollers on either side of the moving workpiece.

These preferred forms of the invention enable the simultaneous surface cleaning of selected first and second surfaces of a workpiece, which surfaces are mutually opposed and may be opposite major faces of a laminar workpiece.

Each said surface-cleaning roller in either aspect of the invention is preferably provided with a respective adherent peripheral surface of a first degree of adhesive tackiness. Each said surface-cleaning roller or each said pair of surface-cleaning rollers is preferably provided with a respective backup adhesive roller in rolling contact therewith, each said backup adhesive roller being provided with a respective adherent peripheral surface of a second degree of adhesive tackiness greater than said first degree of adhesive tackiness.

One or both surface-cleaning rollers in each roller bight is preferably provided with roller driving means for driving a workpiece through the bight when the bight is closed. The roller driving means is preferably reversible for bi-directionally driving the workpiece through the surface cleaning apparatus.

Embodiments of the invention will now be described, by way of example, with reference to the accompanying drawing which is a schematic diagram of a preferred embodiment.

Referring to the drawing, a surface cleaning apparatus 10 is designed and arranged for double-sided cleaning of laminated photolichographic masks (not shown) travelling through the apparatus 10 on a vertical path 12.

One side of the laminated mask is cleaned of surface particulates by means of a pair of surface-cleaning rollers 14 and 16 arranged in tandem along the path 12, while the other side of the mask is cleaned of surface particulates by means of a further pair of surface-cleaning rollers 18 and 20 also arranged in tandem along the path 12. In known manner, the peripheral surfaces of each of the rollers 14, 16, 18 and 20 are provided with respective adherent surfaces of a first degree of adhesive tackiness which each transfer particulates initially present on the surface of the mask to the adherent surface in rolling contact with the mask. Also in known manner, backup adhesive rollers (not shown) with adherent surfaces of a second degree of adherent tackiness greater than the first degree of adherent tackiness are in rolling contact with the surface-cleaning rollers 14, 16, 18 and 20 (but not in contact with the mask being cleaned). The backup adhesive rollers gather particulates picked up by the cleaning rollers, and so maintain the efficiency of the cleaning rollers. These backup adhesive rollers are omitted from the accompanying drawing for the sake of clarity.

Each of the surface-cleaning rollers 14, 16, 18 and 20 has its respective axis of rotation orthogonally transverse to the path 12 and parallel to the major faces of the masks being cleaned in the apparatus 10, the rollers being controllably rotated by a suitable roller drive (not shown). Each of the surface-cleaning rollers 14, 16, 18 and 20 is mounted to have its respective axis of rotation controllably movable towards or away from the path 12 under the control of a respective actuator 22, 24, 26 and 28.

The lower pair of surface-cleaning rollers 14 and 18 form a lower bight about the path 12, and their respective actuators 22 and 26 are arranged for conjoint operation such that either or both of the rollers 14 and 18 are moved mutually together to close the lower roller bight on the path 12 (and to close the rollers 14 and 18 on to any mask concurrently passing along that part of the path 12), or both of the rollers 14 and 18 are moved mutually apart to open the lower roller bight on the path 12 (and to pull the rollers 14 and 18 away form any mask concurrently passing along that part of the path 12).

Similarly, the upper pair of surface-cleaning rollers 16 and 20 form an upper bight about the path 12, and their respective actuators 24 and 28 are arranged for conjoint operation such that either or both of its rollers 16 and 20 are moved mutually together to close the upper roller bight on the path 12 (and to close the rollers 16 and 20 on to any mask concurrently passing along that part of the path 12), or both of the rollers 16 and 20 are moved mutually apart to open the upper roller bight on the path 12 (and to pull the rollers 16 and 20 away from any mask concurrently passing along that part of the path 12).

It is to be noted that although the lower rollers 14 and 18 conjointly move mutually together or mutually apart by reason of the conjoint operation of their respective actuators 22 and 26, while the upper rollers 16 and 20 also conjointly move mutually together or mutually apart by reason of the conjoint operation of their respective actuators 24 and 28, movements of the lower rollers 14 and 18 and movements of the upper rollers 16 and 20 are mutually independent. In other words, the lower bight (14+18) opens and closes independently of opening or closing of the upper roller bight (16+20), and vice versa. Opening and closing of the lower (14+18) and upper (16+20) roller bights in normal operation of the apparatus 10 is coordinated with the position along the path 12 of a mask being cleaned, in a manner which will be detailed subsequently.

In order to detect the presence of at least one part of a mask at critical positions along the path 12, the apparatus 10 further comprises a lower mask sensor 30, an intermediate mask sensor 32, and an upper mask sensor 34. The lower mask sensor 30 is located just below the lower rollers 14 and 18, the lower sensor 30 comprising a beam emitter 30A on one side of the path 12 and a beam detector 30B on the other side of the path 12. The intermediate mask sensor 32 is located between the lower roller pair 14+18 and the upper roller pair 16+20, the intermediate sensor 32 comprising a beam emitter 32A on one side of the path 12 and a beam detector 32B on the other side of the path 12. The upper mask sensor 34 is located just above the upper rollers 16 and 20, the upper sensor 34 comprising a beam emitter 34A on one side of the path 12 and a beam detector 34B on the other side of the path 12.

In normal operation of the apparatus 12, each of the beam emitters 30A, 32A, and 34A continuously emits a beam of radiation (eg of visible light or of infra-red light) directed onto the respective one of the beam detectors 30B, 32B, and 34B which is aligned and sensitised to respond to the reception or absence of the beam from the respective emitter. If the respective part of the path 12 is clear, the appropriate detector will receive the beam from the respective emitter, and the relevant sensor will signal "path clear". On the other hand, it a mask (or other essentially opaque article) is present along the path 12 at the level of on of the sensors, the relevant beam is blocked and the sensor will signal "path occupied".

The apparatus 10 further comprises a lower mask guide 36 for constraining a mask to the path 12 below the lower roller bight (14+18), and an upper mask guide 38 for constraining a mask to the path 12 above the upper roller bight (16+20). The guides 36 and 38 may, for example, be a grid of wires or other members which non-damagingly confine the mask sufficiently closely to the path 12 without inducing significant restraint to movement of the mask in either direction along the path 12. If necessary or desirable, an intermediate mask guide (not shown) may be provided between the lower and upper roller pairs.

In normal operation of the surface cleaning apparatus 10 the apparatus goes through a cycle of operations on one mask at a time, as follows:

At the start of a cycle, the apparatus 10 is empty of any mask, the actuators 22 and 26 are operated so retract the rollers 14 and 18 and so open the lower roller bight, and the actuators 24 and 28 are operated to retract the rollers 16 and 20 and so open the upper roller bight.

A mask (not shown) is put into the bottom of the apparatus 10, generally in alignment with the lower end of the path 12, and manually lifted through the lower roller pair 14 and 18, until the leading (upper) end of the mask is simultaneously detected by both the lower and intermediate sensors 30 and 32.

The simultaneous "path occupied" signal from the lower and intermediate sensors 30 and 32 causes a central control system (not shown) to operate the actuators 22 and 26 to push the lower rollers 14 and 18 towards one another such that they close on to the loading (upper) end of the mask, so as to grip the mask. The roller drive is than started up so as to turn the rollers 14 and 18 in a direction which pulls the mask up into the apparatus 10, feeding the leading (upper) edge between the still retracted upper rollers 16 and 20.

When the upper sensor 34 detects the leading (upper) end of the upwardly moving mask, the actuators 24 and 28 are operated to push the upper rollers 16 and 20 towards one another such that they close on to the leading (upper) end of the mask, just below the leading (upper) edge of the mask, so as to grip the mask.

The roller drive then acts to turn the mask-gripping rollers 14, 16, 18, and 20 in directions which draw the mask up through the apparatus 10 and between the lower and upper roller pairs (14+18, 16+20) such that the adhesive-surfaced peripheries of these rollers roll over both major faces of the mask and thereby substantially clean the mask of surface particulates.

When the lower and intermediate sensors 30 and 32 simultaneously signal "path clear" by reason of the trailing (lower) end of the mask having passed upwardly through these sensors, the roller drive is halted, the apparatus 10 having completed the first (upward) phase of its complete cycle. The apparatus 10 now pauses, pending receipt of a signal to commence the second (downward) phase of its complete cycle. Meanwhile, the mask is held up by having its trailing (lower) end gripped between the still-closed upper rollers 16 and 20, the mask being prevented from toppling or folding by the upper guide 38.

Thereafter, a suitable switch (not shown) or other control is manually or automatically operated to signal to the central control system that the second phase of the cleaning cycle should commence and proceed as follows:

The actuators 22 and 26 are operated to withdraw the lower rollers 14 and 18 from one another, and so open the lower roller bight. The roller drive is then restarted, but in the opposite direction to its previous rotation, ie such as to drive the mask downwards along the path 12.

As soon as the intermediate and lower sensors 32 and 30 simultaneously register "path occupied", the central control system operates the actuators 22 and 26 to push the lower rollers 14 and 18 towards one another such that they close on to the lower end of the mask (which is now the leading end of the mask because the mask is now travelling downwards), just above the leading (lower) edge of the mask, so as to grip the mask.

The roller drive then acts to turn the mask-gripping rollers 14, 16, 18, and 20 in directions which draw the mask down through the apparatus 10 and between the upper and lower roller pairs (16+20 & 14+18) such that both major faces of the mask are again cleaned by the adhesive-surfaced peripheries of these rollers as they roll over the descending mask.

When the mask has travelled completely through the apparatus 10 in a downward direction, all three sensors 30, 32, and 34 will register "path clear".

The roller drive is temporarily halted when the upper sensor 34 registers "path clear" but the intermediate and lower sensors 32 and 30 still register "path occupied". This halts the downward movement of the newly-cleaned mask while still holding the mask between the lower rollers 14 and 18. When the operator is ready to take hold of the mask, this can be signalled by manual operation of a suitable switch (not shown) coupled to the central control system which accordingly restarts the roller drive to finish feeding the mask down and out of the apparatus 10 directly into the hands of the operator. Thereupon all three sensors register "path clear" and the central control system will halt the roller drive, and also operate all four actuators 22, 24, 26, and 28 to withdraw all of the rollers 14, 16, 18, and 20 from the path 12. This concludes a complete cycle of operation of the surface cleaning apparatus 10 and the apparatus halts at the end of the complete cleaning cycle.

It will be noted that while portions of the mask will be cleaned by both upper and lower rollers on both upward and downward passes of the mask through the apparatus 10, all portions of the mask (including both ends of the mask) will be cleaned by one or both pairs of rollers on at least one of the upward and downward double passes of the mask through the apparatus 10. For example, because the leading (upper) end of the mask is always fed between initially open roller bights in order to avoid pinching and denominating the leading end during the first (upward) phase of the cleaning cycle, the upper end of the mask escapes being cleaned by the rollers during the first phase, but this upper end of the mask becomes the trailing end during the second (downward) phase of the cleaning cycle, and passes between both upper and lower pairs of rollers while they are closed, to be cleaned thereby The invention provides the important advantage that selectively openable roller bights enable the introduction of a leading end of a mask (or other workpiece to be cleaned) between the opened rollers of a given bight without the pinching or crushing effect of permanently closed roller bights that risks delamination of susceptible workpieces. This advantage applies whether the workpiece path is vertical, horizontal, or any intermediate angle.

In its version having a substantially vertical workpiece path, the invention also provides the important advantage of requiring a much reduced floor space compared to conventional surface cleaning apparatus in which the workpiece path is horizontal. This advantage applies whether the roller bights are selectively and independently openable or not.

A preferred embodiment of the invention has been described above by way of example, along with alternative cycles of operation. Modifications and variations of the preferred embodiment and/or of the cycle of operation can be adopted without departing from the scope of the invention.

What is claimed is:

1. A surface cleaning apparatus for cleaning at least one surface of a substantially planar workpiece, comprising a first pair of rollers selectively movable towards and away from each other, a second pair of rollers selectively movable towards and away from each other, at least one roller of each pair being provided with a respective adherent peripheral surface of a first degree of adherent tackiness, at least one roller of each pair being provided with roller driving means operable to cause the roller pair to function as drive rollers when closed together, said roller driving means being reversible, and each roller being coupled to a respective roller actuator operable to move the roller towards and away from the other member of the pair;

the roller actuators being selectively operable to bring one or both pairs of rollers into driving engagement with the workpiece to drive the workpiece through the apparatus;

and the reversible roller driving means and the roller actuators being operable in synchronism such that a workpiece is passed through the apparatus in forward and reverse directions with the leading edge of said workpiece in either direction passing through each pair of rollers while that pair is open.

2. Apparatus as claimed in claim 1, wherein each said roller is provided with a respective backup adhesive roller in rolling contact therewith, each said backup adhesive roller being provided with a respective adherent peripheral surface of a second degree of adhesive tackiness greater than said first degree of adhesive tackiness.

3. Apparatus as claimed in claim 1, in which the pairs of rollers are arranged substantially vertically one above the other to define a substantially vertical workpiece path.

4. Apparatus as claimed in claim 1, in which both rollers in each pair of rollers have an adherent peripheral surface of said first degree of adhesive tackiness.

5. Apparatus as claimed in claim 1, in which the apparatus effects the simultaneous surface cleaning of both sides of the workpiece.

* * * * *